United States Patent

Van Gorsel

Patent Number: 5,184,089
Date of Patent: Feb. 2, 1993

[54] DIFFERENTIAL AMPLIFIER HAVING OUTPUT CURRENT LIMITING

[75] Inventor: Jan Van Gorsel, Almelo, Netherlands

[73] Assignee: U.S. Philips Corporation, New York, N.Y.

[21] Appl. No.: 869,277

[22] Filed: Apr. 15, 1992

[30] Foreign Application Priority Data

Apr. 26, 1991 [EP] European Pat. Off. ........ 91201004.8

[51] Int. Cl.$^5$ .............................................. H03F 3/45
[52] U.S. Cl. .................................... 330/254; 330/261
[58] Field of Search ...................... 330/252, 254, 261; 307/494, 557, 559

[56] References Cited

U.S. PATENT DOCUMENTS 4,479,094 10/1984 Harris ................................. 330/261

FOREIGN PATENT DOCUMENTS 63-80605 4/1988 Japan .

Primary Examiner—James B. Mullins
Attorney, Agent, or Firm—Bernard Franzblau

[57] ABSTRACT

A differential amplifier having output current limiting includes; first and second transistors ($T_1$, $T_2$) and first and second output terminals (1, 10) coupled to a first main electrode of the respective first and second transistors first current terminal (5) is coupled to a second current terminal (15) first and second diodes ($D_1$, $D_2$) have their anodes coupled to respective second main electrodes of the first and second transistors and their cathodes coupled to the first and second current terminals first and second current sources are coupled to the second main electrodes of the respective first and second transistors for applying first and second currents ($I_1$, $I_2$), to the first and second transistors. Third and fourth current sources are coupled to the first and second current terminals for applying third and fourth currents ($I_3$, $I_4$) to the first and second current terminals. Reference voltages are applied to the control electrodes of the first and second transistors. Fifth and sixth current sources apply to the first and second current terminals fifth and sixth currents ($I_5$, $I_6$) which are smaller than and opposite to the third and fourth currents. A third diode ($D_3$) and a reverse fourth diode ($D_4$) are arranged between the first and second current terminals. First and second signal current sources are coupled to the first and second current terminals for applying a first signal current ($+I_i$) and a reverse second signal current ($-I_i$) thereto. As a result of the signal current control on the current terminals the signal transmission from the current terminals (5, 15) to the output terminals is independent of the non-linear characteristic of the first and second transistors and the first and second diodes.

6 Claims, 1 Drawing Sheet

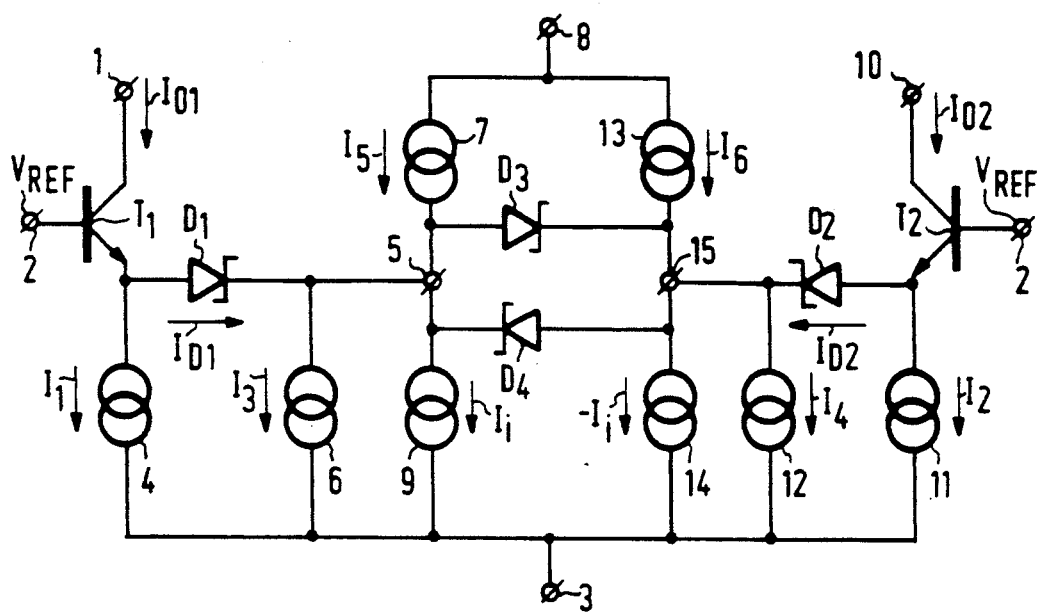

DIFFERENTIAL AMPLIFIER HAVING OUTPUT CURRENT LIMITING

BACKGROUND OF THE INVENTION

This invention relates to a differential amplifier having output current limiting, comprising:

first and second transistors each having a control electrode, a first and a second main electrode;

first and second output terminals coupled to the first main electrodes of the respective first and second transistors;

a first current terminal and a second current terminal coupled to the first current terminal;

at least a first diode having an anode coupled to the second main electrode of the first transistor and a cathode coupled to the first current terminal;

at least a second diode having an anode coupled to the second main electrode of the second transistor and a cathode coupled to the second current terminal;

a first current source coupled to the second main electrode of the first transistor for applying a first current to the first transistor;

a second current source coupled to the second main electrode of the second transistor for applying a second current to the second transistor;

a third current source coupled to the first current terminal for applying a third current to the first current terminal;

a fourth current source coupled to the second current terminal for applying a fourth current to the second current terminal.

A differential amplifier of this type is known from Japanese Patent Application No. 61-226486 of which an abstract has been published in Japan Patent Abstracts under No. 63-80605. Differential amplifiers having output current limiting are generally applied to electronic amplifier circuits in which the dynamic signal range is to be kept within certain limits in order to avoid overload.

In the prior-art differential amplifier the first and second current terminals are interconnected, the third and fourth current sources are united into a single current source and the whole amplifier is driven by means of a differential signal on the control electrodes of the first and second transistors. Depending on the sign of the differential signal the first or second diode will no longer be conductive and will block once the differential signal has exceeded a certain value. The output current of the first or second transistor coupled to either diode will then be limited to the first or second current. The advantage of this prior-art differential amplifier is that the output currents are limited due to a switching operation by the first or second diode and not by the first or second transistor. The first and second transistors continue to be conductive so that the limiting of the output currents is only determined by the switching behavious of the diodes. This enables a proper limiting at high frequencies.

A disadvantage of the prior-art differential amplifier is the fact that the signal transmission is rather non-linear in the range where there is no current limiting yet. The non-linear voltage-current transfer as it is from the control electrode to the second main electrode of the first and second transistors is additionally distorted by the non-linear impedance of the first and second diodes.

SUMMARY OF THE INVENTION

It is an object of the invention to provide a differential amplifier having output current limiting with a linear signal transmission.

According the invention, a differential amplifier defined in the opening paragraph and comprising output current limiting is characterized in that the differential amplifier further comprises:

means for applying reference voltages to the control electrodes of the first and second transistors;

a fifth current source coupled to the first current terminal for applying to the first current terminal a fifth current which is smaller than the third current and is opposite to the third current;

a sixth current source coupled to the second current terminal for applying to the second current terminal a sixth current which is smaller than the fourth current and is opposite to the fourth current;

at least a third diode whose anode is coupled to the first current terminal and whose cathode is coupled to the second current terminal;

at least a fourth diode whose cathode is coupled to the first current terminal and whose anode is coupled to the second current terminal;

a first signal current source coupled to the first current terminal for applying a first signal current to the first current terminal;

a second signal current source coupled to the second current terminal for applying to the second current terminal a second signal current which is opposite to the first signal current.

In lieu of voltage control effected on the control electrodes of the first and second transistors, according to the invention current control is effected on the first and second current terminals. The non-linearity of the first and second transistors and of the first and second diodes do not play any role now. The third and fourth diodes discharge the remaining current on the first or second current terminal to the other current terminal once the first or second diode has blocked.

An embodiment of a differential amplifier according to the invention is characterized in that the fifth current of the fifth current source and the sixth current of the sixth current source are adjustable.

By making the fifth and sixth current sources adjustable the limiting level of the first and second output currents can be adjusted.

A further embodiment of a differential amplifier according to the invention is characterized in that the first and second currents, the third and fourth currents, the fifth and sixth currents and the first and second signal currents are substantially equally large two-by-two.

In this manner a differential amplifier is obtained having substantially symmetrical output current limiting.

Yet another embodiment of a differential amplifier according to the invention is characterized in that the first to fourth diodes are Schottky diodes.

Schottky diodes present substantially no hole storage effect and are capable of switching very fast. When such Schottky diodes are used, a bandwidth larger than with conventional diodes is obtained.

BRIEF DESCRIPTION OF THE DRAWING

The invention will now be further explained with reference to the annexed drawing in which the drawing FIGURE shows a circuit diagram of a differential amplifier having output current limiting according to the invention.

DESCRIPTION OF THE PREFERRED EMBODIMENT

The drawing FIGURE shows the circuit diagram of a differential amplifier according to the invention in which bipolar npn transistors and Schottky diodes are depicted by way of example. In lieu of bipolar transistors unipolar transistors also may be used, the source, drain and gate then taking the place of the respective emitter, base and collector. In lieu of Schottky diodes also standard bipolar diodes or other elements having a one-way conductive behaviour may be used.

The collector of a transistor $T_1$ is connected to an output terminal 1 in which a first output current $I_{01}$ flows. The base of this transistor is connected to a reference voltage terminal 2 to which a reference voltage $V_{REF}$ is connected, and the emitter is connected to a negative supply terminal 3 through a current source 4 which supplies a current $I_1$. The emitter is also connected to a current terminal 5 across a diode $D_1$, whose anode is connected to the emitter. To current terminal 5 is furthermore connected a current source 6 which draws a current $I_3$ from the current terminal 5 and discharges this current to the negative supply terminal 3, a current source 7 which applies a current $I_5$ smaller than the current $I_3$ to the current terminal 5 from a positive supply terminal 8, and a signal current source 9 which applies a positive signal current $+I_i$ to the current terminal 5. The signal current source 9 is connected, by way of example, between the current terminal 5 and the negative supply terminal 3, but may also be connected to the positive supply terminal 8. Another possibility is that the current source 6 and the signal source 9 form a common source.

The differential amplifier further includes a second transistor $T_2$, a diode $D_2$, an output terminal 10 in which an output current $I_{02}$ flows, a current source 11 for supplying a current $I_2$, a current source 12 for supplying a current $I_4$, a current source 13 for supplying a current $I_6$, a signal current source 14 for supplying a negative signal current $-I_i$, and a current terminal 15, which are connected in the same manner as the corresponding components, i.e. the respective transistor $T_1$, diode $D_1$, output terminal 1, current sources 4, 6 and 7, signal source 9 and current terminal 5. Between the current terminals 5 and 15 two anti- parallel arranged diodes $D_3$ and $D_4$ are inserted, the anode of diode $D_3$ being connected to the current terminal 5 and the cathode of diode $D_4$ being connected to current terminal 15, so that two-way current conduction is possible between the current terminals. Furthermore, it is assumed that the corresponding current sources supply equally large currents, thus: $I_2=I_1$; $I_4=I_3$, $I_6=I_5$, and that the positive signal current $+I_i$ and the negative signal current $-I_i$ have an equally large absolute value. Should these conditions not be satisfied, the output currents $I_{01}$ and $I_{02}$ will not be limited symmetrically. This has no further consequences as to the basic operation of the differential amplifier.

In the linear control range caused by input currents $+I_i$ and $-I_i$, the diodes $D_1$ and $D_2$ will be conductive and the diodes $D_3$ to $D_4$ will block. Under the above conditions, the currents $I_{D1}$ across diode $D_1$ and $I_{D2}$ across diode $D_2$ will be:

$$I_{D1}=I_3-I_5+I_i$$

$$I_{D2}=I_3-I_5-I_i.$$

As long as the absolute value of the input current $I_i$ is smaller than $(I_3-I_5)$, diodes $D_1$ and $D_2$ will be conductive and the output currents $I_{01}$ and $I_{02}$ will vary with the input currents. The current $I_3$ is thus to exceed the current $I_5$. If the absolute value of the input current $I_i$ exceeds $(I_3-I_5)$, either diode $D_1$ or diode $D_2$ will block. If the input current $+I_i$ exceeds $(I_3-I_5)$, diode $D_2$ will block and if the input current $-I_i$ exceeds $(I_3-I_5)$, diode $D_1$ will block. The current sources 4 and 11 prevent the transistors $T_1$ and $T_2$ from becoming currentless. If, for example, the current $+I_i$ exceeds $(I_3-I_5)$, diode $D_2$ will block and an excessive current will be developed on current terminal 15. Consequently, the voltage on current terminal 15 will rise relative to the voltage on the other current terminal 5. The threshold voltage of the diode $D_4$ will be exceeded so that the diode will start conducting. The remaining current will then flow from current terminal 15 to current terminal 5 and be captured by the other signal current source 9. The current across diode $D_1$ and hence also the output current $I_{01}$ will thus no longer increase so that the two output currents are limited simultaneously. Due to the current control on current terminals 5 and 15 the non-linear voltage-current characteristics of the diodes $D_1$ and $D_2$ and of the base-emitter junctions of the transistors $T_1$ and $T_2$ have no effect on the output currents $I_{01}$ and $I_{02}$. During this control there is a voltage jump across the current terminals 5 and 15 which is equal to the voltage of a forward biased diode.

In lieu of a single diode it is also possible to connect a plurality of diodes in series, either in combination or not with a series resistor, between the current terminals 5 and 15. The voltage jump between the current terminals is determined, for example, by the number, knee voltage and series resistance of the diodes. A small voltage jump is favourable at high frequencies because the charging and discharging of any parasitic capacitances on the current terminals will then cause minimum noise currents to occur in the signal currents.

If so desired, the current sources 7 and 13 may be rendered adjustable for adjusting the point of limiting. If no balanced input currents $+I_i$ and $-I_i$ are available, they may be derived from the input voltages in a manner known in the art. If more than one diode is inserted between the emitters of the transistors $T_1$ and $T_2$ and current terminals 5, 15 respectively, the number of diodes in the series combinations between the current terminals 5 and 15 are to be extended correspondingly so as to avoid a premature current path occurring between the current terminals 5 and 15.

I claim:

1. A differential amplifier having output current limiting, comprising:
   first and second transistors each having a control electrode and a first and a second main electrode;
   first and second output terminals coupled to the first main electrodes of the respective first and second transistors;
   a first current terminal and a second current terminal;
   at least a first diode having an anode coupled to the second main electrode of the first transistor and a cathode coupled to the first current terminal;
   at least a second diode having an anode coupled to the second main electrode of the second transistor and a cathode coupled to the second current terminal;

a first current source coupled to the second main electrode of the first transistor for applying a first current ($I_1$) to the first transistor;

a second current source coupled to the second main electrode of the second transistor for applying a second current ($I_2$) to the second transistor;

a third current source coupled to the first current terminal for applying a third current ($I_3$) to the first current terminal;

a fourth current source coupled to the second current terminal for applying a fourth current ($I_4$) to the second current terminal;

means for applying reference voltages to the control electrodes of the first and second transistors;

a fifth current source coupled to the first current terminal for applying to the first current terminal a fifth current ($I_5$) which is smaller than the third current ($I_3$) and is opposite to the third current;

a sixth current source coupled to the second current terminal for applying to the second current terminal a sixth current ($I_6$) which is smaller than the fourth current ($I_4$) and is opposite to the fourth current;

at least a third diode whose anode is coupled to the first current terminal and whose cathode is coupled to the second current terminal;

at least a fourth diode whose cathode is coupled to the first current terminal and whose anode is coupled to the second current terminal;

a first signal current source coupled to the first current terminal for applying a first signal current ($+I_i$) to the first current terminal; and a second signal current source coupled to the second current terminal for applying to the second current terminal a second signal current ($-I_i$) which is opposite to the first signal current ($+I_i$).

2. A differential amplifier as claimed in claim 1, wherein the fifth current of the fifth current source and the sixth current of the sixth current source are adjustable.

3. A differential amplifier as claimed in claim 2, wherein the first and second currents, the third and fourth currents, the fifth and sixth currents and the first and second signal currents are substantially equally large two-by-two.

4. A differential amplifier as claimed in claim 2, wherein the first to fourth diodes comprise Schottky diodes.

5. A differential amplifier as claimed in claim 1, wherein the first and second currents, the third and fourth currents, the fifth and sixth currents and the first and second signal currents are substantially equally large two-by-two.

6. A differential amplifier as claimed in claim 1 wherein the first to fourth diodes comprise Schottky diodes.

* * * * *

UNITED STATES PATENT AND TRADEMARK OFFICE
CERTIFICATE OF CORRECTION

PATENT NO. : 5,184,089
DATED : February 2, 1993
INVENTOR(S) : Jan Van Gorsel

It is certified that error appears in the above-indentified patent and that said Letters Patent is hereby corrected as shown below:

On the Title Page, in the Abstract:

Line 5, after "tors" insert --.  A--;
Line 6, change "(15) first" to --(15).  First--;
Line 10, change "nals first" to --nals.  First--.

Column 1, line 65, delete "as it is";
Column 3, line 64, change "to" to --and--.

Signed and Sealed this

Nineteenth Day of April, 1994

Attest:

BRUCE LEHMAN

Attesting Officer                Commissioner of Patents and Trademarks